United States Patent
Hutchison et al.

(10) Patent No.: US 8,593,866 B2
(45) Date of Patent: Nov. 26, 2013

(54) SYSTEMS AND METHODS FOR OPERATING MULTI-BANK NONVOLATILE MEMORY

(75) Inventors: Neil David Hutchison, Campbell, CA (US); Alan David Bennett, Edinburgh (GB); Robert Jackson, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/294,880

(22) Filed: Nov. 11, 2011

(65) Prior Publication Data

US 2013/0121075 A1    May 16, 2013

(51) Int. Cl.
*G11C 11/34* (2006.01)
(52) U.S. Cl.
USPC ............. 365/185.11; 365/185.09; 365/200; 711/5; 711/202
(58) Field of Classification Search
USPC ............ 365/185.09, 185.11, 200; 711/5, 202
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,706,407 A * | 1/1998 | Nakamura et al. | 700/251 |
| 5,768,192 A | 6/1998 | Eitan | |
| 5,862,083 A * | 1/1999 | Tobita et al. | 365/185.09 |
| 5,903,495 A | 5/1999 | Takeuchi et al. | |
| 5,930,167 A | 7/1999 | Lee et al. | |
| 5,936,971 A | 8/1999 | Harari et al. | |
| 6,011,725 A | 1/2000 | Eitan | |
| 6,046,935 A | 4/2000 | Takeuchi et al. | |
| 6,151,268 A * | 11/2000 | Yoshikawa | 365/230.09 |
| 6,222,762 B1 | 4/2001 | Guterman et al. | |
| 6,456,528 B1 | 9/2002 | Chen | |
| 6,715,025 B2 * | 3/2004 | Kanno et al. | 711/5 |
| 7,057,939 B2 | 6/2006 | Li et al. | |
| 7,197,595 B2 * | 3/2007 | Asari et al. | 711/103 |
| 7,353,325 B2 * | 4/2008 | Lofgren et al. | 711/103 |
| 7,356,641 B2 * | 4/2008 | Venkiteswaran | 711/103 |
| 7,506,098 B2 * | 3/2009 | Arcedera et al. | 711/103 |
| 7,877,569 B2 | 1/2011 | Honda | |
| 8,040,744 B2 * | 10/2011 | Gorobets et al. | 365/200 |
| 8,347,020 B2 * | 1/2013 | Maddali et al. | 711/5 |
| 2009/0150605 A1 | 6/2009 | Flynn et al. | |
| 2009/0150641 A1 | 6/2009 | Flynn et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Viet Q Nguyen
(74) *Attorney, Agent, or Firm* — Davis Wright Tremaine LLP

(57) ABSTRACT

A non-volatile memory system that has multiple memory banks initially assigns logical addresses to memory banks according to an assignment scheme, maintains this assignment for a period of time, then identifies frequently-written data ("hot-data") assigned to a memory bank that is heavily worn over that period of time and reassigns it to a less worn memory bank.

15 Claims, 19 Drawing Sheets

(56) References Cited

U.S. PATENT DOCUMENTS

| | | |
|---|---|---|
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2010/0318720 A1 | 12/2010 | Rajagopalan et al. |

OTHER PUBLICATIONS

CARDINAL Search Report dated Jun. 13, 2011, 2 pages.

* cited by examiner

Programming into four states represented by a 2-bit code

Multistate Memory

Lower Page Programming (2-bit Code)

Upper Page Programming (2-bit Code)

Lower Page Read (2-bit Code)

Upper Page Read (2-bit Code)

SYSTEMS AND METHODS FOR OPERATING MULTI-BANK NONVOLATILE MEMORY

BACKGROUND

This application relates to the operation of re-programmable non-volatile memory systems such as semiconductor flash memory, and, more specifically, to the operation of non-volatile memory systems having multiple memory banks.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency. These undesirable attributes make disk-based storage impractical in most mobile and portable applications. On the other hand, flash memory, both embedded and in the form of a removable card is ideally suited in the mobile and handheld environment because of its small size, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will generally be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is to rewrite the update data in the same physical memory location. That is, the logical to physical address mapping is unchanged. However, this will mean that the entire erase block containing that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

When the currently prevalent LBA interface to the memory system is used, files generated by a host to which the memory system is connected are assigned unique addresses within the logical address space of the interface. The memory system then commonly maps data between the logical address space and pages of the physical blocks of memory. The memory system keeps track of how the logical address space is mapped into the physical memory but the host is unaware of this. The host keeps track of the addresses of its data files within the logical address space but the memory system operates with little or no knowledge of this mapping.

The use of multiple banks of memory in a nonvolatile memory system has been previously described, for example in US Patent Publication No. 2010/0318720.

Using RAM in a write cache operating with a flash memory has been disclosed in U.S. Pat. No. 5,936,971 to Harari et al.

Partitioning the memory into two portions one operating in binary and the other in MLC has been disclosed in U.S. Pat. No. 5,930,167 to Lee et al and U.S. Pat. No. 6,456,528 to Chen, the entire disclosure of which is incorporated therein by reference.

There is a general need for high capacity and high performance non-volatile memory. In particular, there is a need to have a high capacity nonvolatile memory that operates with multiple banks of memory over an extended period of time.

SUMMARY OF THE INVENTION

According to a general aspect of the invention, a multi-bank nonvolatile memory system may be operated so that if one memory bank is more heavily-worn because some frequently-written data is assigned to it, the frequently-written data may be identified and reassigned to another less-worn memory bank. This may be done when the heavily-worn memory bank is approaching an end-of-life condition in order to extend its operational life. Alternatively, it may be done periodically during the operational life of the memory system. Less-frequently-written data from a less-worn memory bank may also be reassigned to the heavily-worn memory bank to replace the frequently-written data (i.e. data may be swopped between memory banks). Stored versions of frequently-written and less-frequently-written data may be copied from their respective locations to another location, and then copied back to their swopped locations (i.e. frequently-written data copied to less-worn memory bank, and less-frequently-written data copied to the heavily-worn memory bank).

According to an embodiment, a method of operating a multi-bank nonvolatile memory system that has a plurality of banks, each with its own logical-to-physical mapping, includes: assigning units of data to be stored by the multi-bank nonvolatile memory system to individual banks of the plurality of banks, based on logical addresses of the units of data to be stored, according to a predetermined assignment scheme; maintaining the assignment of the units of data to the individual banks of the plurality of banks throughout a first period of operation of the multi-bank nonvolatile memory system; subsequently, identifying at least one unit of data that is assigned to a first bank by the predetermined assignment scheme as frequently written data; in response to identifying the at least one unit of data as frequently written data, reassigning the frequently written data to a second bank of the plurality of banks; and maintaining the reassignment of the frequently written data for a second period of operation of the multi-bank nonvolatile memory system.

The first period of operation may extend from initialization of the multi-bank nonvolatile memory system until a predetermined amount of wear has occurred, and the second period of operation may extend from after the first period of operation until end of life of the multi-bank nonvolatile memory system. The predetermined assignment scheme may stripe data across the plurality of banks. In response to identifying the at least one unit of data as frequently written data, a copy of the frequently written data may be copied from the first bank to the second bank. At least one unit of data in the second bank may be identified as infrequently written data. In response to identifying the at least one unit of data as infrequently written data, the infrequently written data may be reassigned from the second bank to the first bank; and the reassignment of the infrequently written data may be maintained for the second period of operation of the multi-bank nonvolatile memory system. For units of data that are not identified as either frequently written data or infrequently written data, assignment according to the predetermined assignment scheme may be maintained throughout the first period of operation and throughout the second period of operation.

According to an embodiment, a method of operating a multi-bank memory system includes: assigning units of data to individual memory banks of a plurality of memory banks according to an assignment scheme; mapping units of data that are assigned to a memory bank to physical locations within the memory bank according to a bank-specific logical-to-physical address mapping function; maintaining a logical-to-physical address map for the memory bank that records physical locations at which units of data are stored in the bank; and in response to determining that at least one unit of data that is assigned by the assignment scheme to the memory bank is frequently written, reassigning the at least one unit of data previously assigned to the memory bank to at least one other memory bank of the plurality of memory banks.

The reassignment may include modifying an address used by the multi-bank memory system for the at least one unit of data so that the predetermined assignment scheme assigns the at least one unit of data to the at least one other bank. Data previously stored in the bank may be copied to the at least one other bank. An address used by the multi-bank memory system may be swopped for the at least one unit of data for an address used by the multi-bank memory system for another at least one unit of data that was previously stored in the at least one other bank. The assignment scheme may stripe units of data across banks. The memory bank may be identified as a worn bank prior to reassigning the at least one unit of data.

A multi-bank nonvolatile memory system, according to an embodiment, includes: a plurality of nonvolatile memory banks, an individual one of the plurality of nonvolatile memory banks maintaining a logical-to-physical address translation table that records locations at which data is physically located within physical memory of the individual nonvolatile memory bank; a front-end logic unit that assigns units of data to be stored by the multi-bank nonvolatile memory system to individual banks of the plurality of banks, based on logical addresses of the units of data to be stored, according to a predetermined assignment scheme, for a first period of operation of the multi-bank nonvolatile memory system; a hot-data identification unit that identifies one or more portions of data as frequently written over the first period of operation; and a reassignment unit that reassigns the one or more portions of data that are identified as frequently written, such that the one or more portions of data are assigned for a second period of operation, that is subsequent to the first period of operation, to individual banks of the plurality of banks that are different to the individual banks to which they were assigned for the first period of operation.

A multi-bank nonvolatile memory system may include a hot-bank identification unit that identifies a memory bank of the plurality of banks as a heavily worn memory bank. The multi-bank nonvolatile memory system may include a cold-data identification unit that identifies one or more portions of data as infrequently written over the first period of operation. The multi-bank nonvolatile memory system may include a cold-bank identification unit that identifies a memory bank of the plurality of banks as a lightly worn memory bank. The plurality of nonvolatile memory banks of the multi-bank nonvolatile memory system may contain NAND flash memory blocks.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
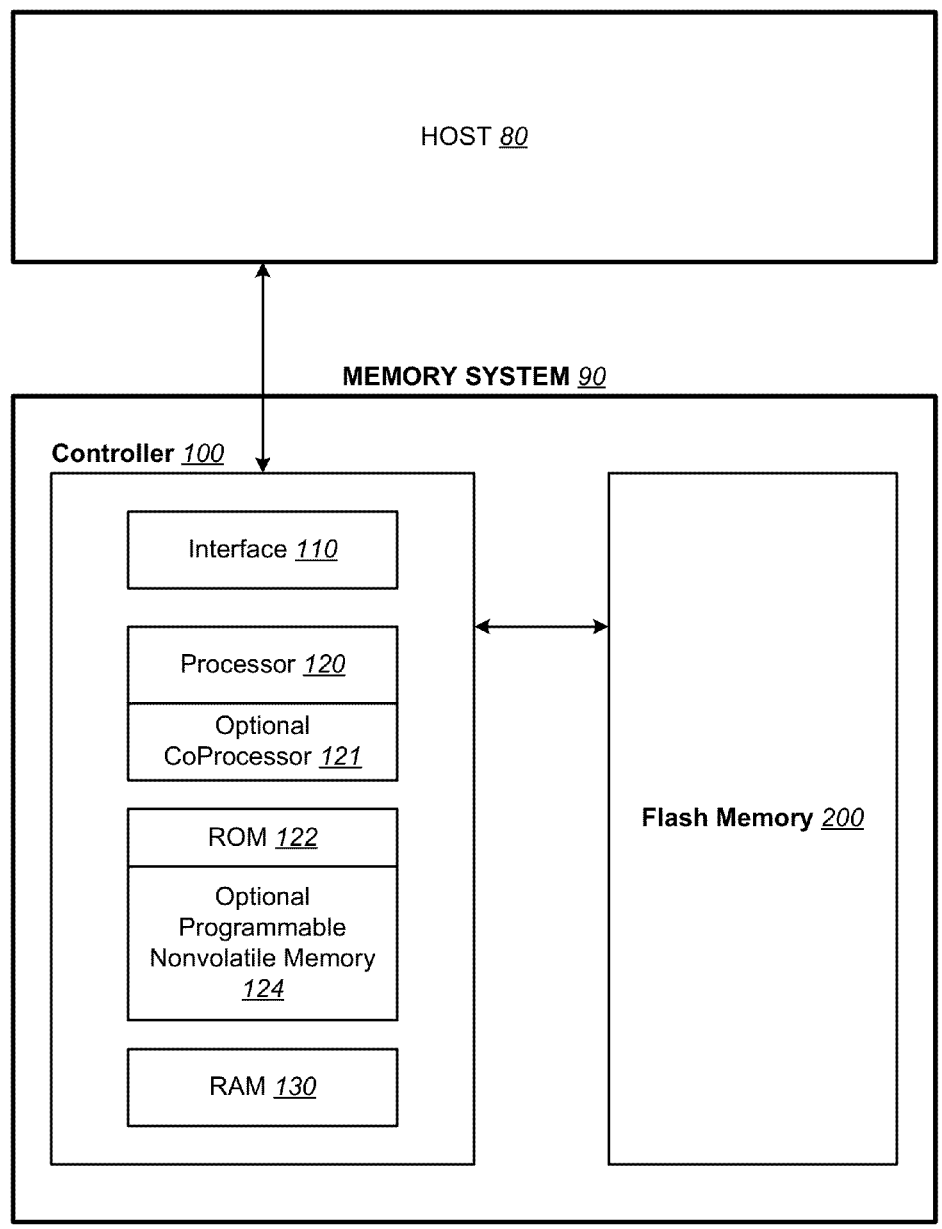
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
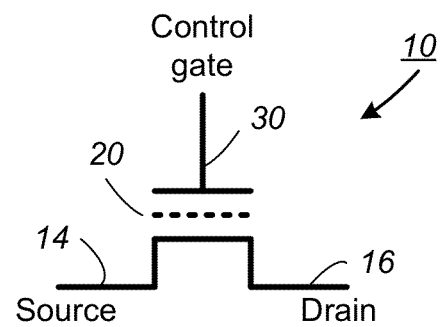
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
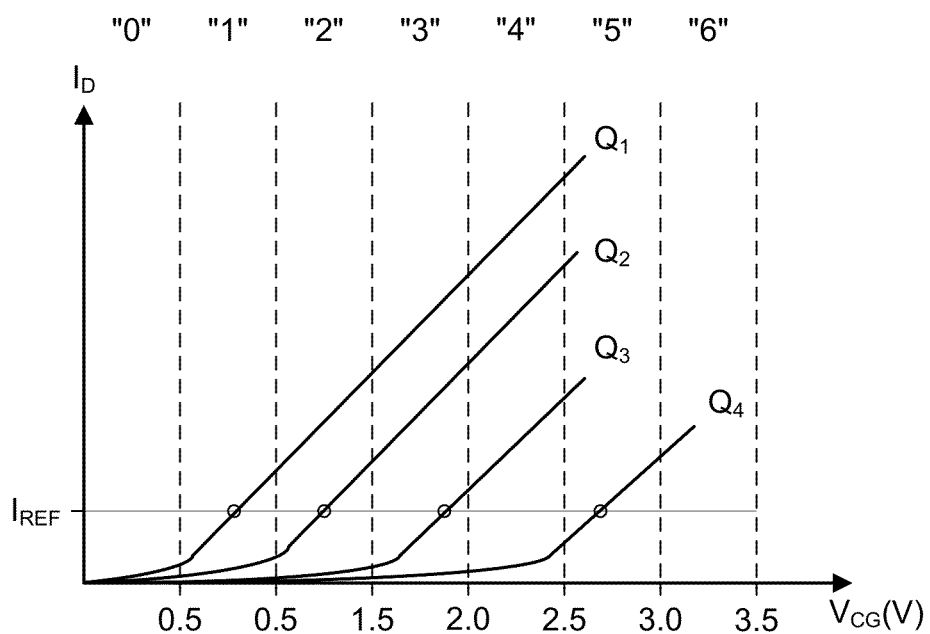
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
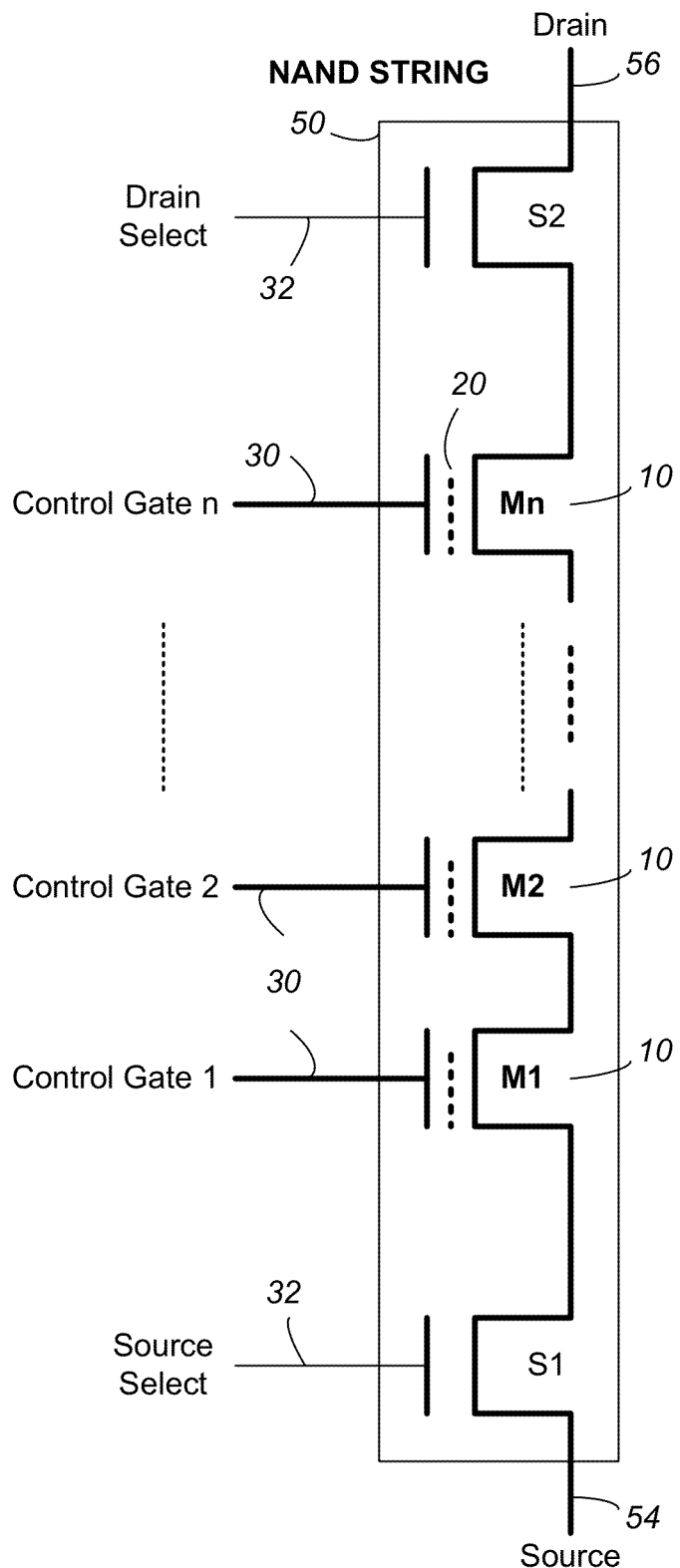
FIG. 4A illustrates schematically a string of memory cells organized into an NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
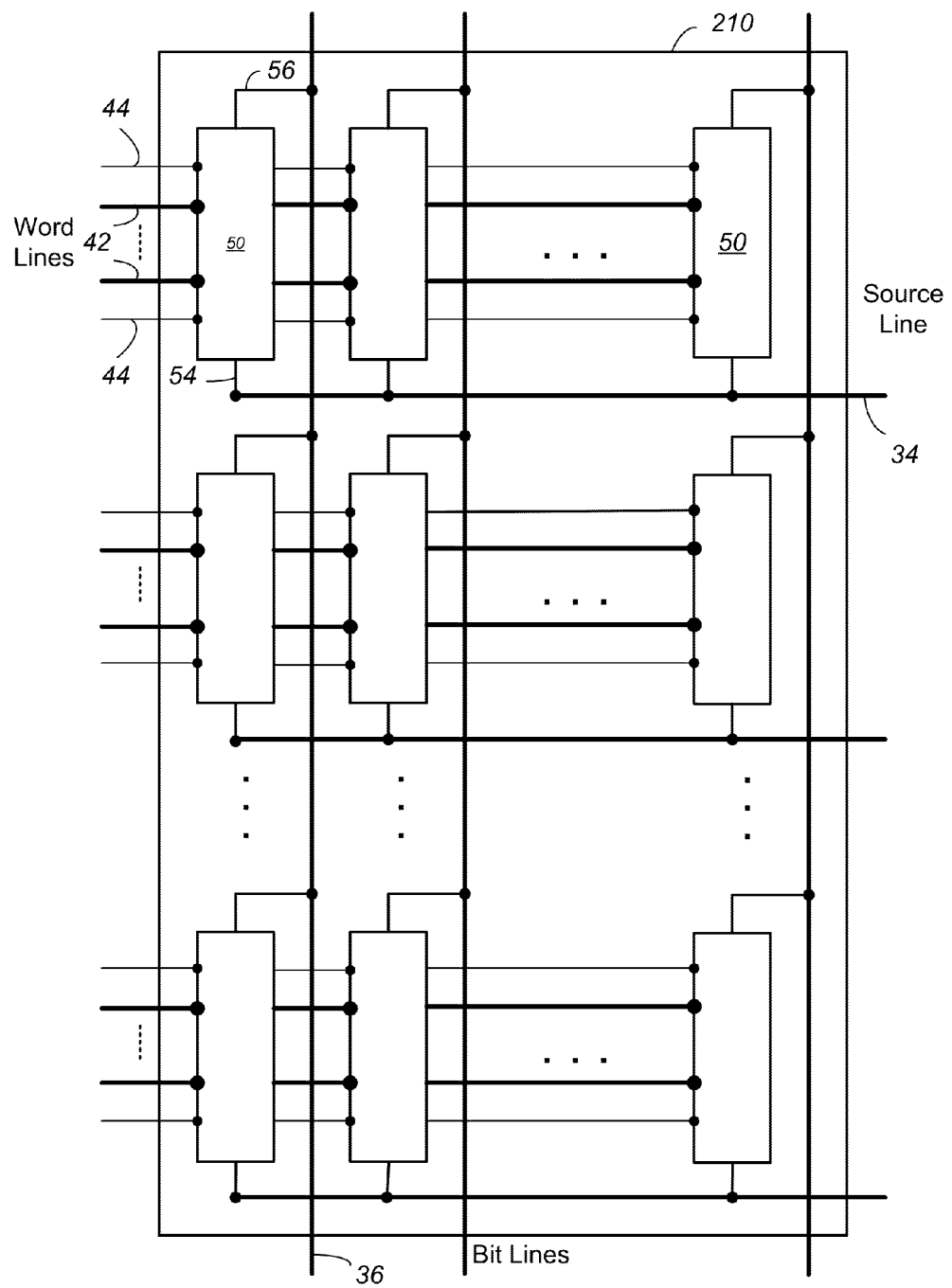
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
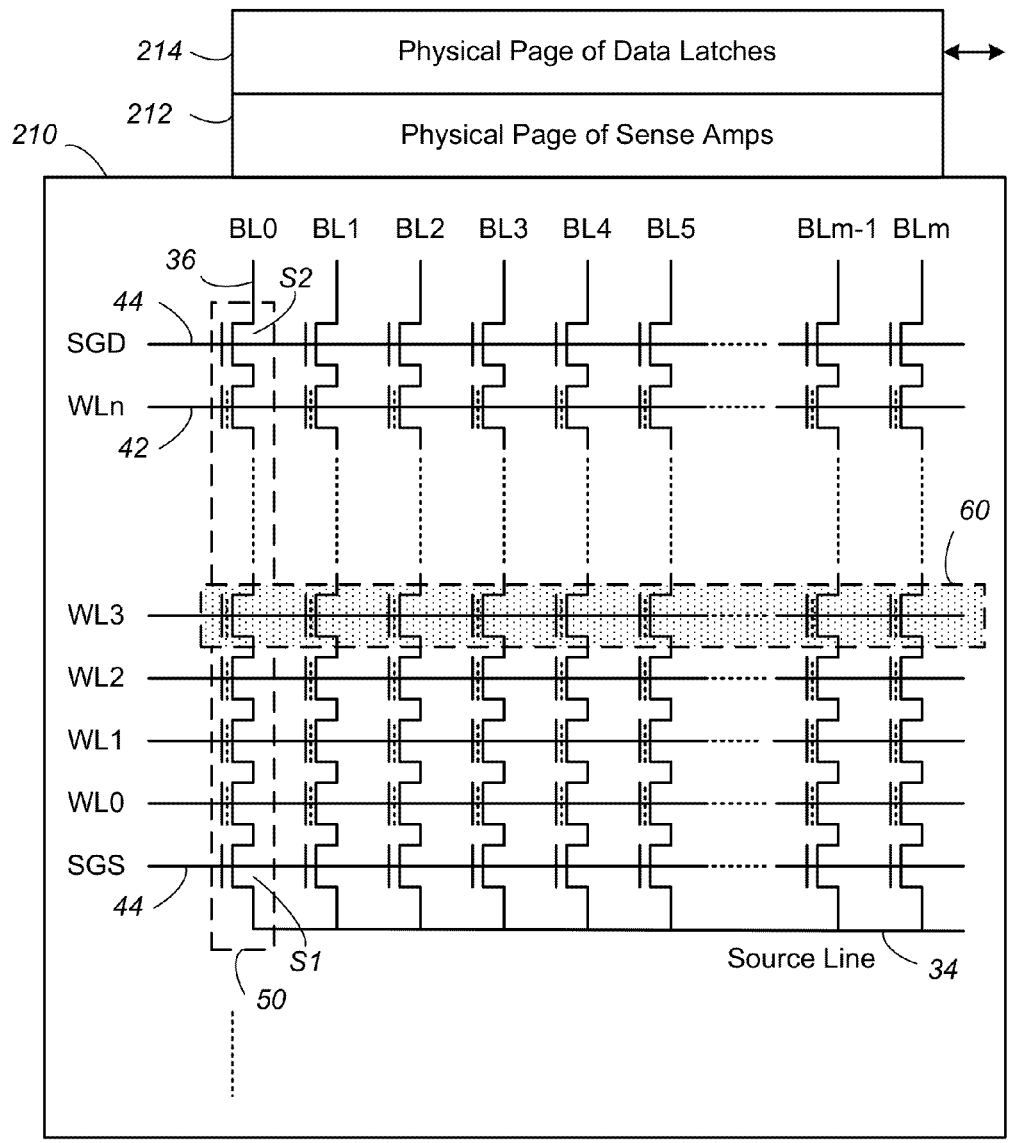
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
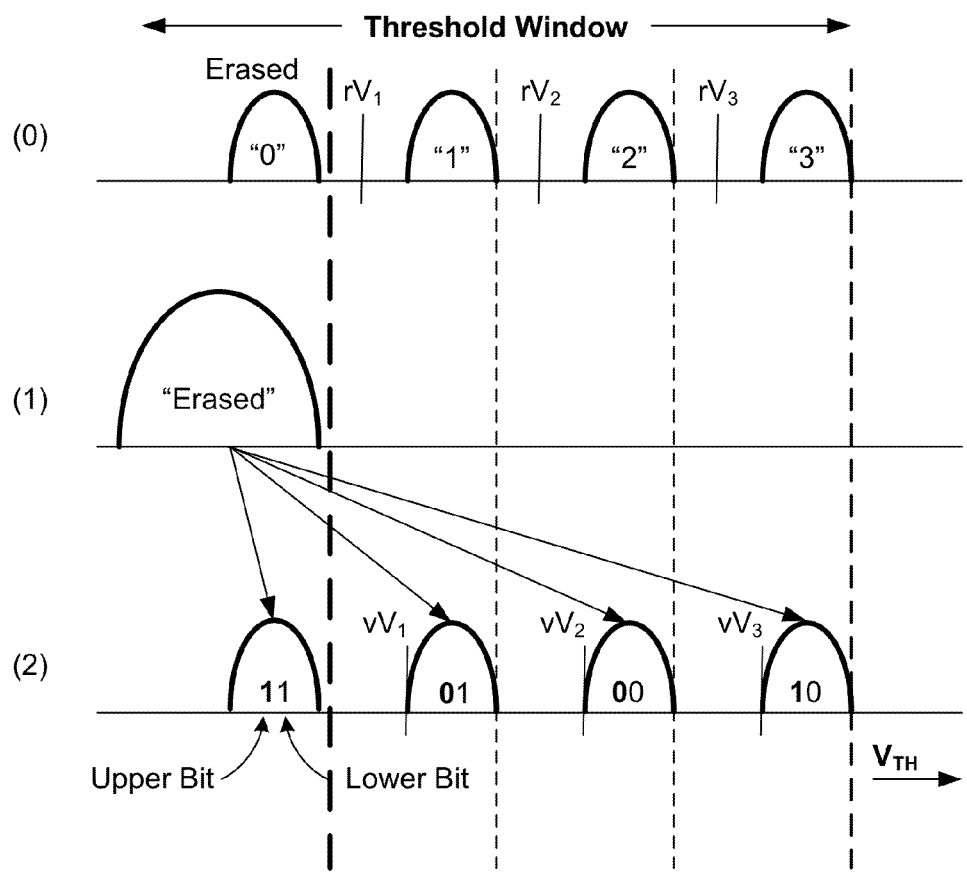
FIG. 6(0)-6(2) illustrate an example of programming a population of 4-state memory cells.

FIG. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
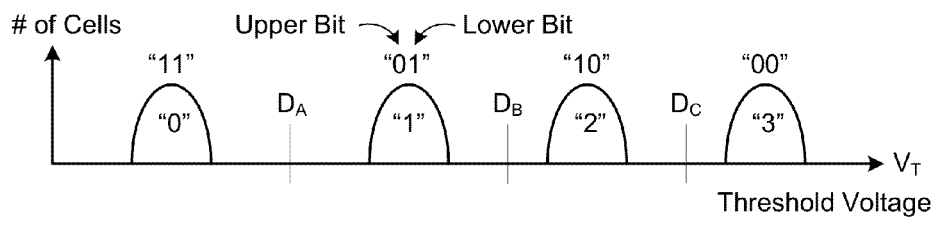
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
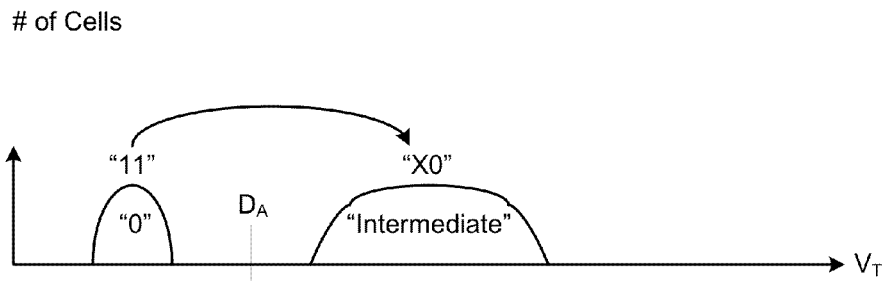

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
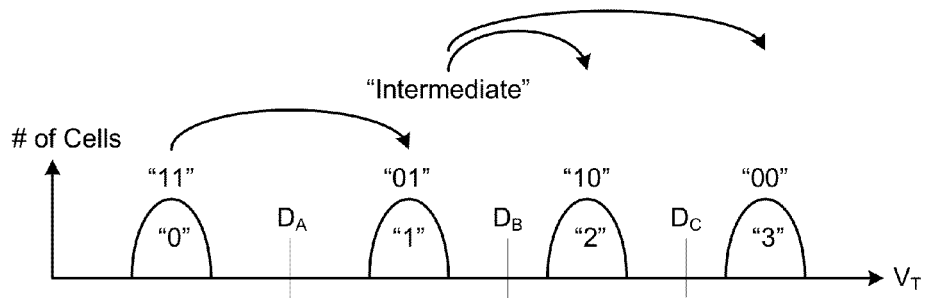

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
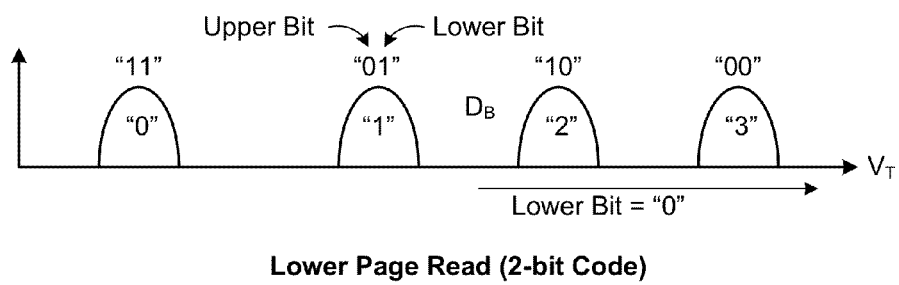

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
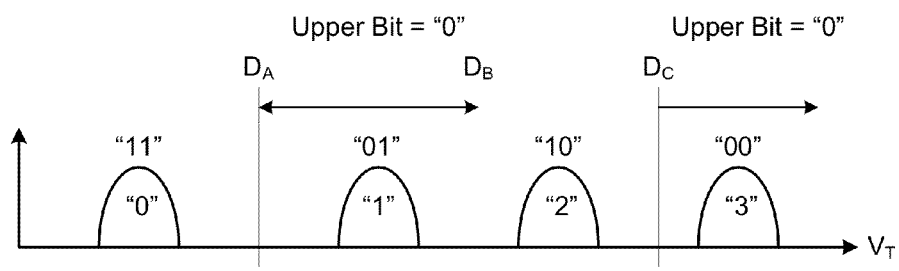

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charge is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. However it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

The bit-by-bit multi-pass programming technique may be compromised by partial-page programming in some cases, for example in MLC memory. A page is a group of memory cells, typically along a row or word line, that is programmed together as a unit. It is possible to program non overlapping portions of a page individually over multiple programming passes. However, because not all cells of the page are programmed in a final pass together, it may create large difference in charges programmed among the cells after the page is done. Thus partial-page programming may result in more program disturb and may require a larger margin for sensing accuracy. This may be an acceptable solution in some cases, but not in others. In one example, partial-page programming is performed for a unit of data that is the unit used for ECC purposes (e.g. block-based ECC such as BCH).

In the case the memory is configured as binary memory, the margin of operation is wider than that of MLC. In one example, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
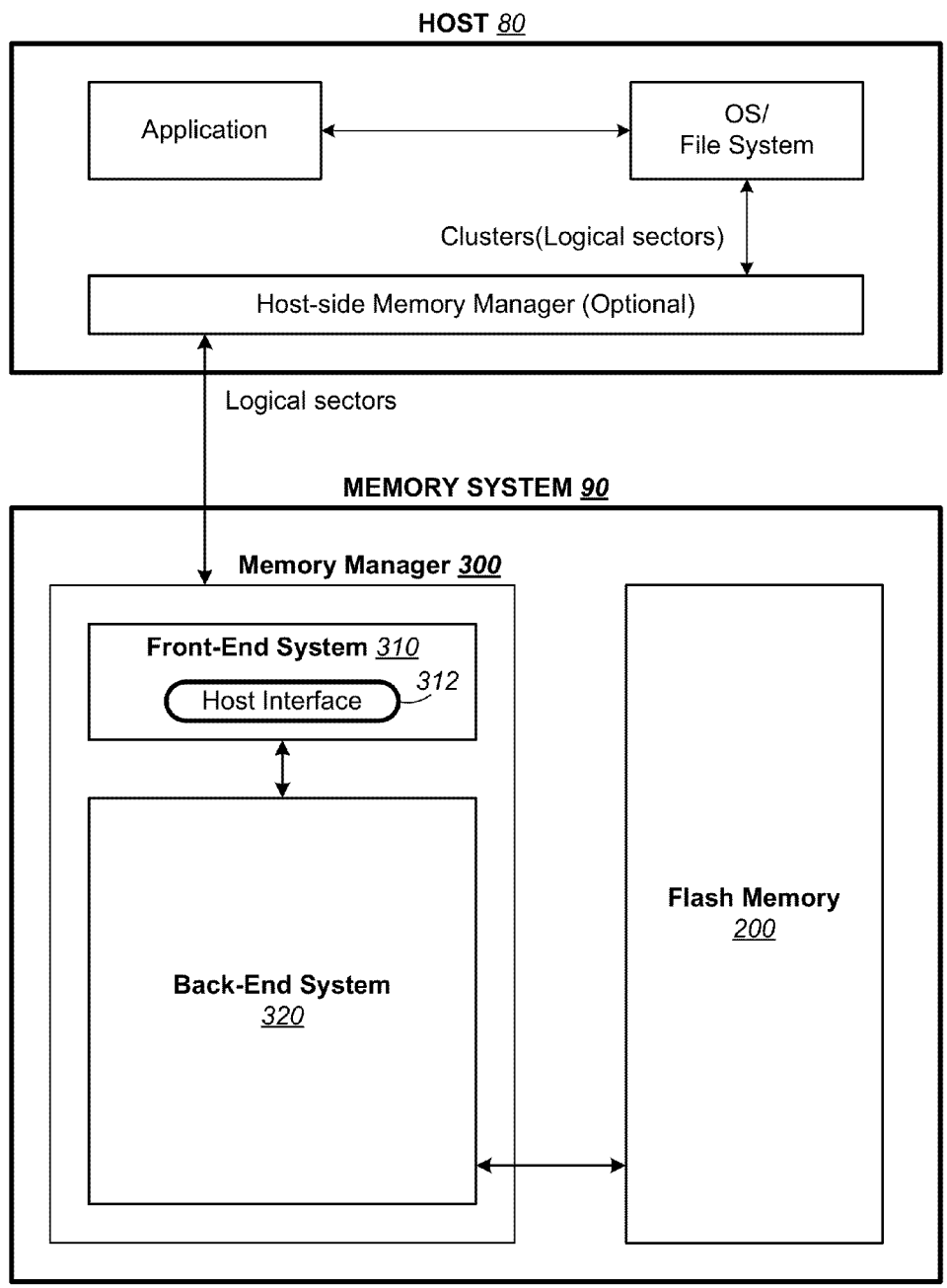
FIG. 8 illustrates the memory being managed by a memory manager with is a software component that resides in the controller.

FIG. 8 illustrates a memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 9:
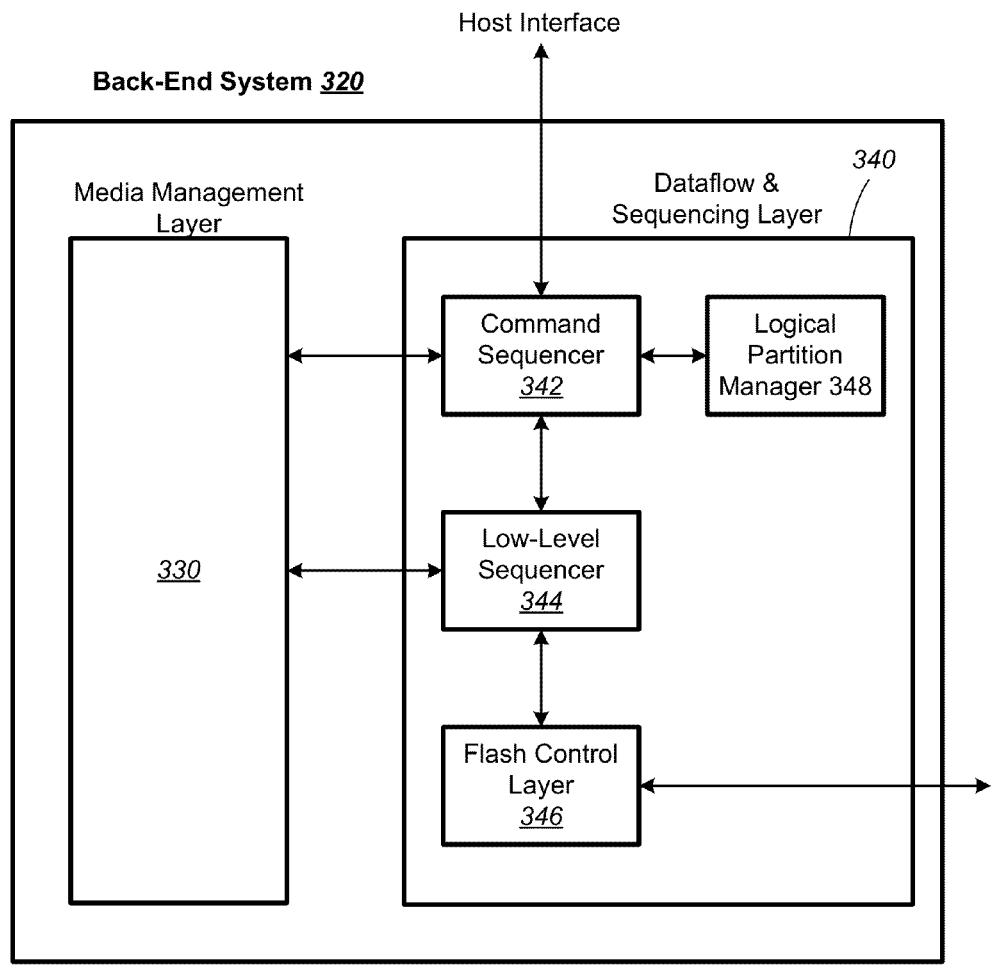
FIG. 9 illustrates the software modules of the back-end system.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure.

The dataflow and sequencing layer 340 is responsible for the sequencing and transfer of sectors of data between a front-end system and a flash memory. This layer includes a command sequencer 342, a low-level sequencer 344, a flash Control layer 346, and a logical partition manager 348.

The memory manager 300 is usually implemented in the controller 100. It translates logical addresses received from the host into physical addresses within the memory array, where the data are actually stored, and then keeps track of these address translations.

Figure 10A:
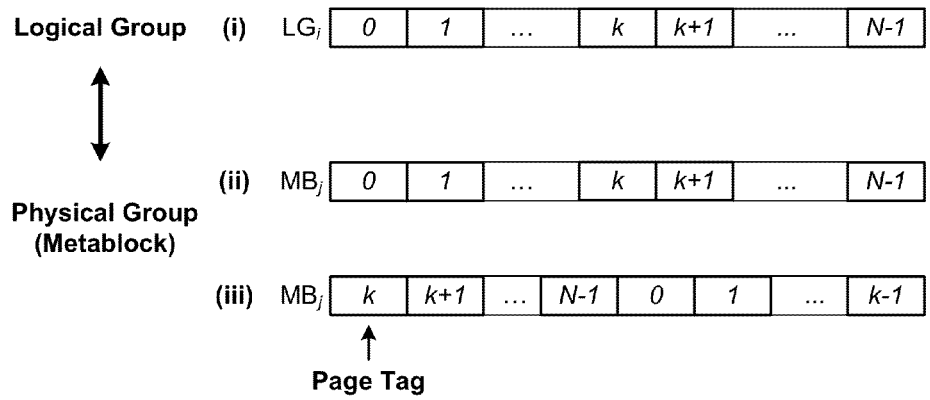
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, ..., N−1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N−1 is reached, it wraps around to sector 0 and finally storing data associated with logical sector k−1 in its last physical sector. In the one example, a page tag is used to identify any offset, such as identifying the starting logical sector address of the data stored in the first physical sector of the metablock. Two blocks will be considered to have their logical sectors stored in similar order when they only differ by a page tag. In systems that store data as shown in FIG. 10A(ii), without any offset between the address range of the logical group and the address range of the metablock, no page tag is needed and the additional overhead of page tags can be eliminated.

Figure 10B:
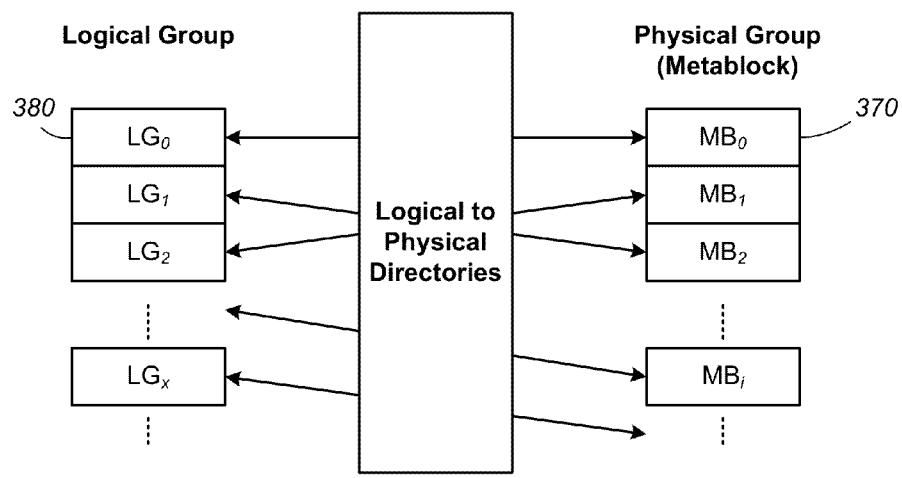
FIG. 10B illustrates schematically the mapping between logical groups and metablocks.

FIG. 10B illustrates schematically the mapping between logical groups and metablocks in a memory where logical group size is equal to metablock size. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later. In another example, a logical group may be smaller than a metablock with logical groups written as they are received from the host (i.e. chaotically, not in order of logical address). Mapping information is maintained that indicates which metablock stores a given logical group, and the offset within the metablock that indicates where the valid copy of the logical group is stored (there may be additional obsolete copies).

Memories Having Multi-Level and Binary Portions
Memory Partitioned into Main and Binary Cache Portions A number of memory system arrangements where the non-volatile memory includes both binary and multi-level sections will now be described. In a first of these, in a flash memory having an array of memory cells that are organized into a plurality of blocks, the cells in each block being erased together, and the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store fewer bits of data in each cell than that of the main memory. Both the cache portion and the main memory portion operate under a block management system for which cache operation is optimized. A more detailed presentation of this material is developed in the following US patent application or provisional application Ser. Nos. 12/348,819; 12/348,825; 12/348,891; 12/348,895; 12/348,899; and 61/142,620, all filed on Jan. 5, 2009.

In one example, individual cells in the cache portion are each configured to store one bit of data while the cells in the main memory portion each stores more than one bit of data.

The cache portion then operates as a binary cache with faster and more robust write and read performances.

In one example, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembled in sequential order in the blocks in the main memory portion.

In one aspect of the invention, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache of the present system has the following features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

Figure 11:
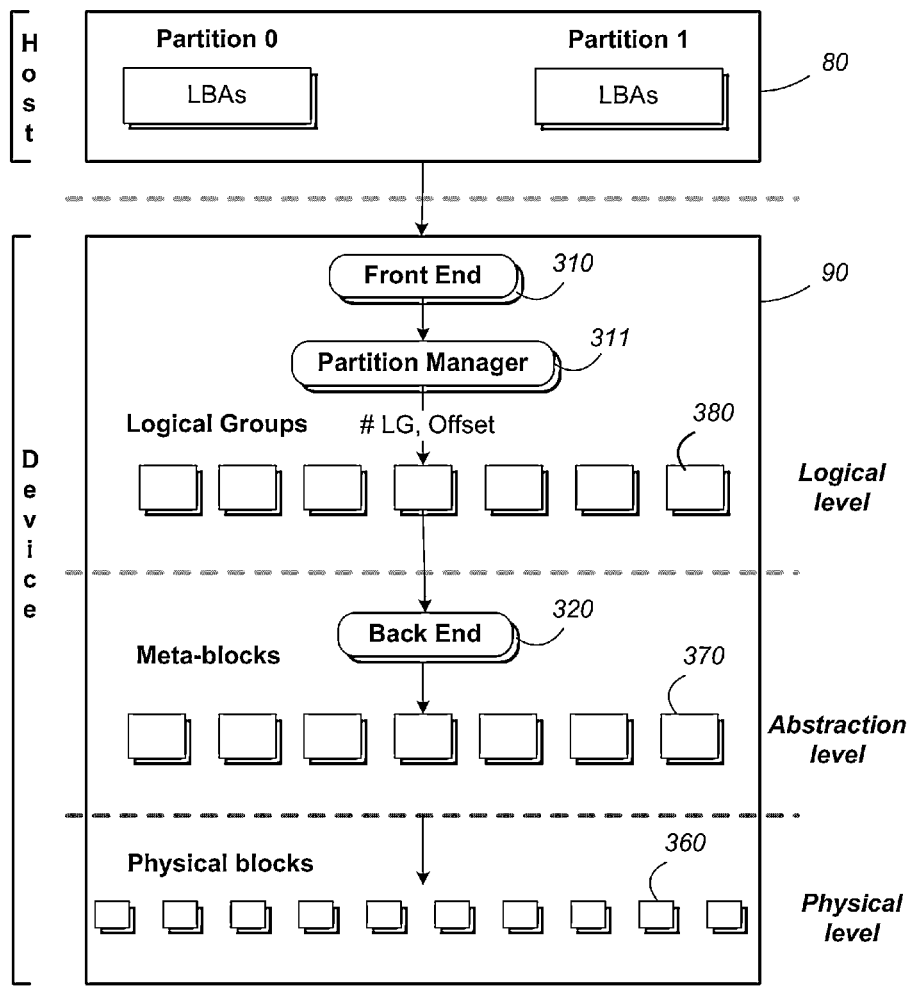
FIG. 11 illustrates a host operating with the flash memory at different levels of the system.

FIG. 11 illustrates a host that is in communication with a memory device where the host specifies partitions for host data to be stored in the memory device. That is, the host specifies that certain portions of its logical address range (Logical Block Addresses, or LBAs) are reserved for particular data. The memory device includes a partition manager 311 in communication with the front end 310. Partition manager 311 is responsible for converting addresses from the host (or front end 310) into addresses used by back end 320. The partition manager 311 assigns data that is received from the host to logical groups in the device. These logical groups are then sent to the back end 320 which maps the logical groups to meta-blocks in the memory array. The metablocks are made up of physical blocks of the memory array. The back end 320 maintains a logical-to-physical mapping which records where individual logical groups are physically stored in the memory array. As data is rewritten by the host, different data with the same host logical address (LBA) may be received by the memory device, resulting in a new version of the data being written at a new physical location. The back end 320 maintains the logical-to-physical mapping so that the most current version of the data may be found if a read request is received from the host. The back end 320 may also track physical locations of obsolete data so that such data can be erased from the memory array.

Figure 12:
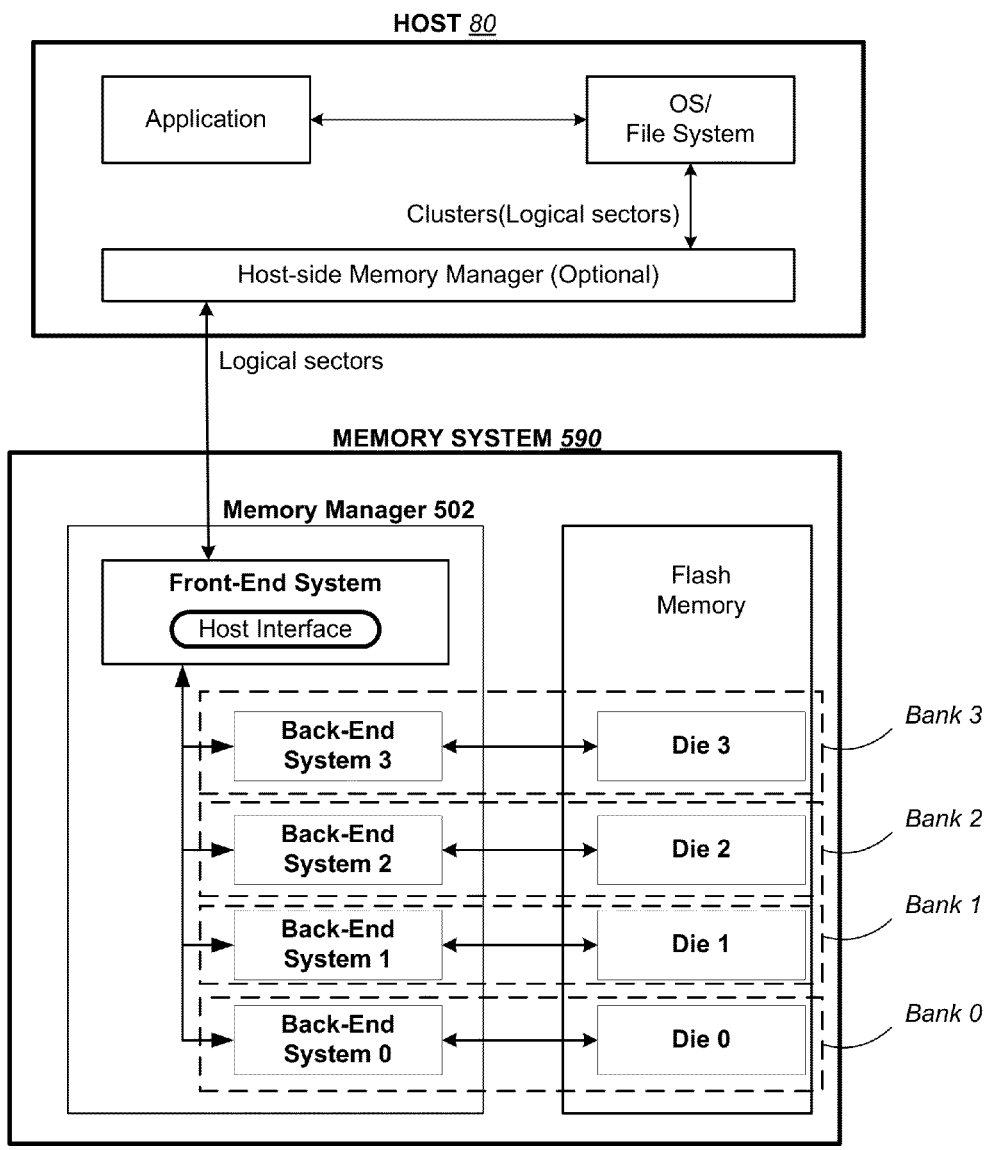
FIG. 12 illustrates a multi-bank memory system having four memory-banks

FIG. 12 illustrates another structure for a memory system 590 in which the memory includes multiple memory banks. Each memory bank may perform some basic operations independently of the front end system. This allows some parallel operation across multiple banks and so provides faster operation. As shown, each bank may include its own back end system and a memory die. So, for example, bank 0 includes back-end system 0 and die 0, bank 1 includes back-end system 1 and die 1, etc. It will be understood that a memory bank is not limited to a single memory die and may have two or more memory dies in communication with a back-end system. Furthermore, while FIG. 12 shows back end systems 0-3 as being within the memory manager 502, these back end systems may not be located in the memory controller. Instead, the back end systems may be physically separate from the controller. In some cases, the back end systems are formed on dedicated chips, or are formed on memory chips to provide high speed communication with the memory they manage. While the example of FIG. 12 shows four separate memory banks, other numbers of memory banks may also be used.

One of the basic operations that may be independently performed by a memory bank is logical-to-physical mapping. Thus, when a memory bank receives data to be stored in that memory bank, a determination is made by the memory bank's back end system as to what physical location or locations should be used to store the data. The memory bank then stores the data at that physical location, or locations, and maintains a map that records the physical locations at which the data is stored. In general, the front-end system is unaware of this operation and does not need to know where the data is physically stored within a given bank. The front-end system simply requests the data from the back-end system of the appropriate bank using its logical address. Then the back-end system uses its logical-to-physical map to determine the physical location of the data within the bank.

Figure 13A:
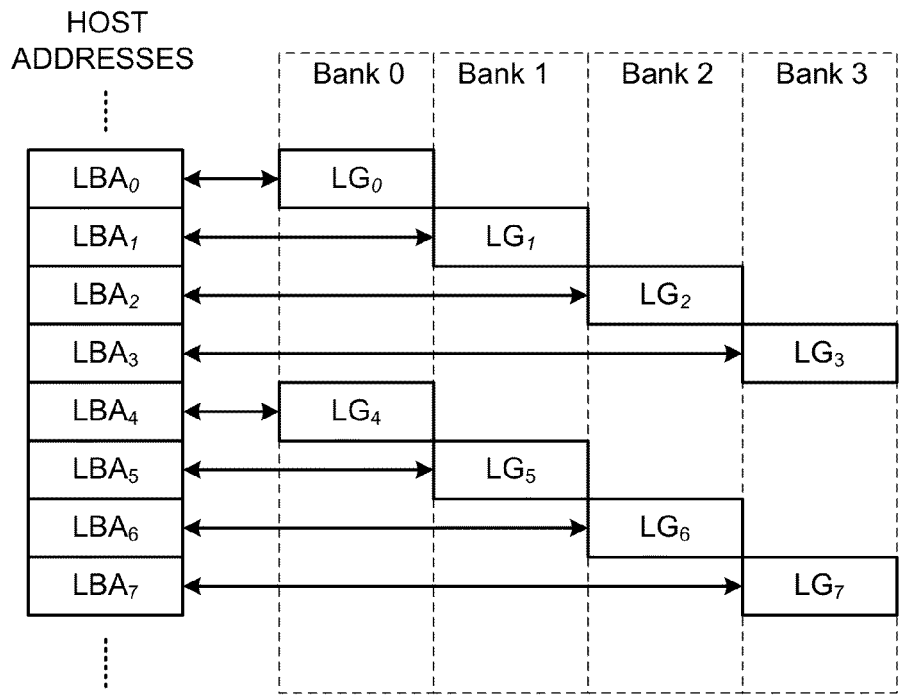
FIG. 13A illustrates mapping of host logical addresses to memory-banks of a multi-bank memory system.
Figure 13B:
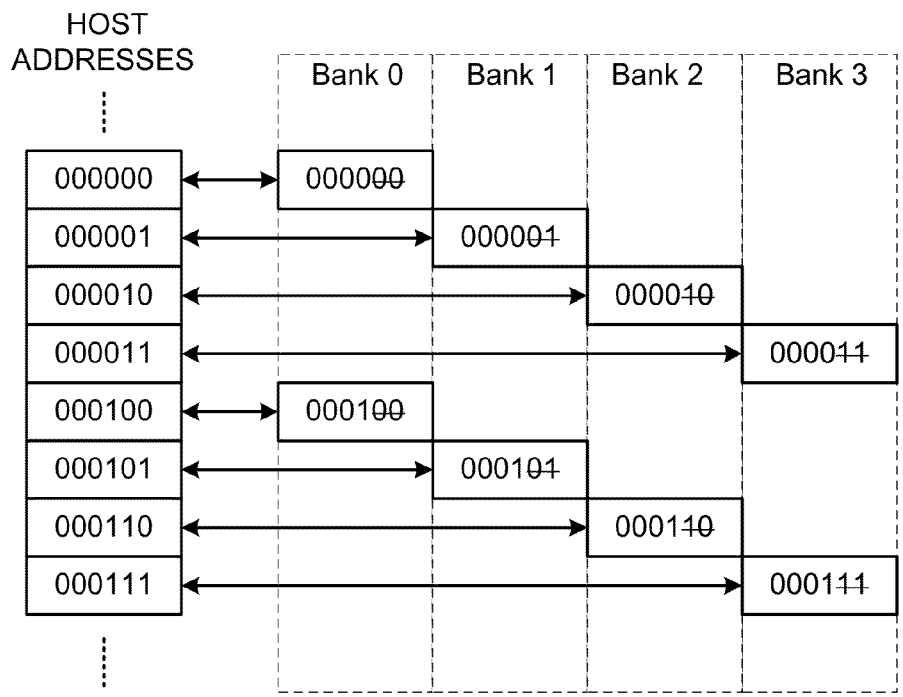
FIG. 13B illustrates mapping of host logical addresses in binary form to memory-banks of a multi-bank memory system.
Figure 13C:
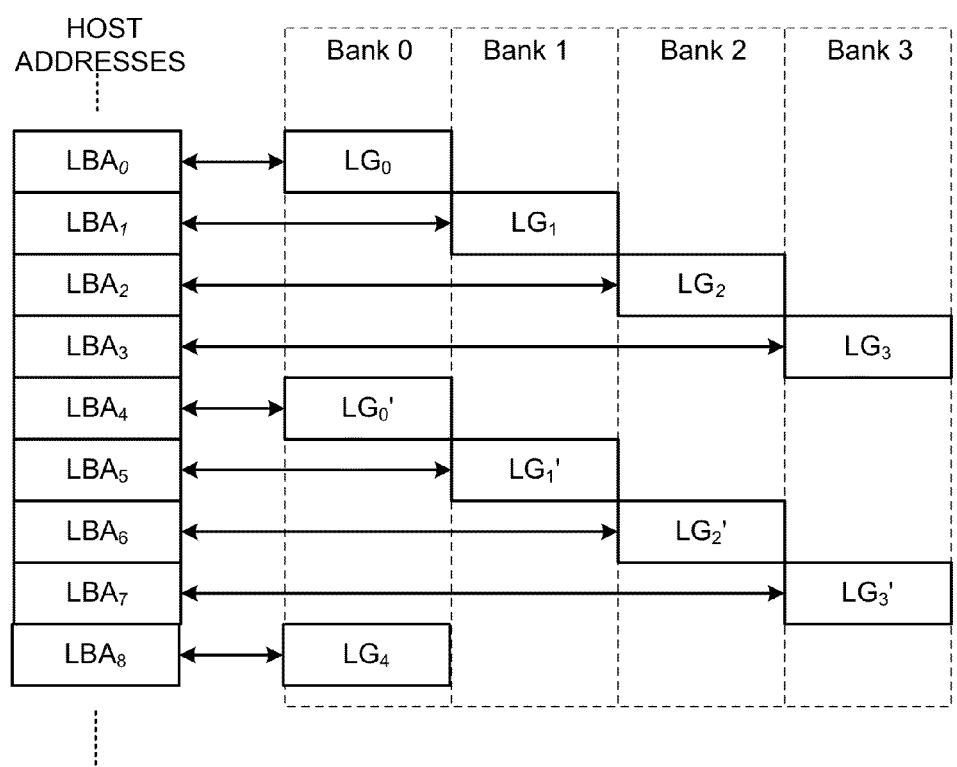
FIG. 13C illustrates an alternative mapping of host logical addresses to memory banks

One function of the front-end in such a multi-bank system is to assign data received from the host (or generated by the memory manager) to memory banks. In one example, logical addresses used by the memory system are striped across the memory banks in a repetitive pattern. Thus, for example, in a device with four memory banks, every fourth logical group is sent to the same memory bank. This arrangement is illustrated in FIG. 13A which shows Logical Groups from the host (numbered LBA0 to LBA7) being assigned to memory banks 0-3 according to a predetermined repetitive assignment scheme. (An alternative striping arrangement is shown in FIG. 13C with an individual Logical Group being mapped to multiple stripes.)

It will be understood that while FIG. 13A shows host addresses, Logical Block Addresses (LBAs), that have a one-to-one correspondence with Logical Groups (LGs) of the memory system, in many cases the units of data used by the host are not the same size as the units used by the memory device. In one example, the logical units used by the host are clusters, with four or more sectors of 512 kbytes each in a cluster. Each cluster has a Logical Block Address, or LBA. The LGs used by the memory device may consist of many clusters where the LG is larger than a cluster. In other examples, a cluster may be larger than an LG with a single cluster mapped to two or more LGs However, for purposes of the present example the difference between host units and memory device units is not important. So, for simplicity, FIG. 13A shows a one-to-one correspondence between host logical units and memory device logical units.

One of the advantages of using multiple banks is that memory operations may be more rapidly performed because of increased parallelism. For example, when data is sent by the host to store in the memory system, the data may be sent to the banks so that two or more banks write the data to the physical memory array in parallel. In a typical write command, the host sends multiple sequential logical groups of data. Such write commands are efficiently handled by the assignment scheme of FIG. 13A because a logical group may be transferred to each memory bank 0-3, and then these logical groups may be written to the physical memory array in parallel, whereas in a single bank arrangement, such writing would generally be sequential.

Assignment of logical addresses to memory banks is generally performed at initialization. After such an assignment is performed, commands are directed to different banks according to the data stored in them. The direction of commands to banks may be performed by a command sequencer. Such a command sequencer (in conjunction with a partition manager in some cases) may be said to act as a translation layer that converts commands from a host (or from the memory controller) into bank-specific commands. Part of this translation may include modifying addresses. FIG. 13B shows how addresses used by a host may be translated into addresses used by individual memory banks in a multi-bank memory system. Host logical addresses are shown here in binary form extending from 000000 to 000111 (corresponding to LBA0-LBA7 of FIG. 13A). As these host logical addresses are assigned to memory banks in a repetitive pattern, it can be seen that the last two bits of each host logical address are the same for a given memory bank. For example, all the host logical addresses assigned to bank 0 end in 00, and all the host logical addresses assigned to bank 1 end in 01. Because each memory bank operates in a largely independent manner, each bank may maintain its own logical addresses without causing conflict with other memory banks. Thus, in the example of FIG. 13B, each memory bank may drop the last two bits of the host logical addresses to obtain the memory bank's logical addresses. This means that each bank uses a logical address range that overlaps with the logical address range of other banks. While the command sequencer recognizes which memory bank it is in communication with, and can adjust accordingly, such operation of multiple addressing schemes generally makes direct communication between memory banks very difficult.

While the assignment of logical groups to memory banks could be considered as a form of logical-to-physical assignment (since memory banks are physical entities) a memory bank is far bigger than a logical group and so merely knowing which memory bank a particular logical group is assigned to does not provide the physical location of that logical group with sufficient specificity that would allow the logical group to be accessed. In this way the assignment of logical groups to memory banks is very different to the logical-to-physical mapping performed within each memory bank which maps a logical group to an exact location in physical memory that allows the logical group to be accessed. That is, the address used is specific to the logical group and not some larger unit or units of data. Another difference is that logical-to-physical mapping within a memory bank is generally not performed in a regular predetermined pattern in the manner of FIGS. 13A-B. Instead, logical addresses are mapped to different physical locations at different times as the data is updated. This can result in highly fragmented arrangements of data that requires maintaining a map of locations for all stored data so that the data can be accessed at a later time. In contrast, the repetitive scheme of FIGS. 13A-B does not require any such mapping because the bank to which a particular unit of data is assigned may be determined simply from the logical address (e.g. the last two bits in FIG. 13B). An alternative arrangement is shown in FIG. 13C in which logical groups consist of two portions that are written in two different write operations. For example, Logical Group 0 (LG0) consists of $LG_0$ and $LG_0'$ which correspond to $LBA_0$ and $LBA_4$ respectively. Such Logical Groups are each written to a single memory bank (e.g. LG0 to bank 0) but are written in two stripes. Other examples may use break down Logical Groups into a different number of portions and write Logical Groups in a different number of stripes.

One problem that may occur over the lifetime of a multi-bank system such that shown in FIG. 12 is that one memory bank may experience more wear than other banks leading to early failure. Because host logical addresses are generally assigned to memory banks in a one-time assignment operation (generally at initialization), if a particular logical address is frequently written, the memory bank to which it is assigned may suffer heavy wear. In many cases, a memory bank may be able to use some wear-leveling techniques to map the frequently written data to different physical locations within the memory bank at different times to prevent heavy wear to any particular physical location within the memory bank. However, over an extended period of time, this may still cause heavier wear in one memory bank than other memory banks. Because of the difficulty of communication between different memory banks which use overlapping logical address ranges, wear-leveling approaches that may work for a single-bank memory system, or within a memory bank in a multi-bank system, are not easily extendable to level wear from bank to bank. In general, it has been assumed that striping of data across multiple banks ensures that frequently written data is spread out reasonably evenly across all banks so that wear is not concentrated in any one memory bank.

According to embodiments of the present invention, a multi-bank memory system may have an initial assignment of logical addresses to memory banks according to some predetermined assignment scheme (e.g. as shown in FIG. 13) and then later, after some significant period of operation, may have the assignment modified for one or more units of data in order to better distribute wear between memory banks. In particular, where a memory bank is identified as heavily worn (a "hot-bank"), and a particular logical group (or other unit of data) assigned to the memory bank is identified as frequently written (identified as "hot-data"); the frequently written data may be reassigned to another memory bank. Such reassignment may occur when the memory device is approaching an end-of-life state (e.g. when the hot-bank is close to failure). The reassignment may be performed just once to extend the life of the device. In other cases, such reassignment may be performed multiple times throughout the operating life of the device.

Figure 14:
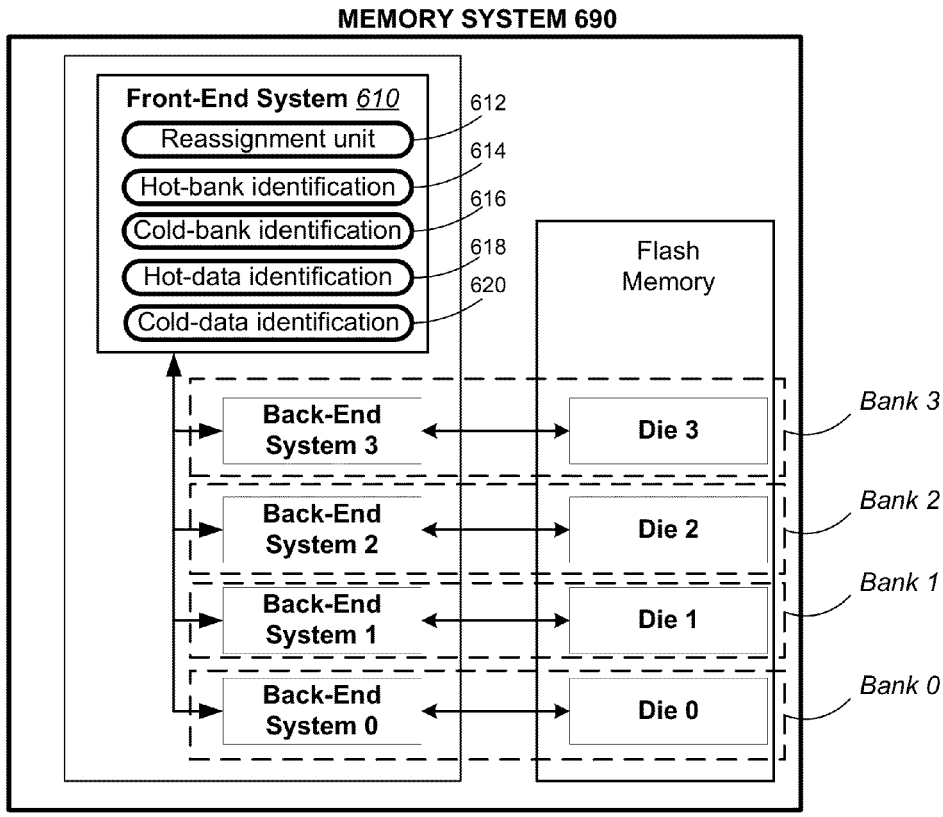
FIG. 14 illustrates some components of a multi-bank memory system.

FIG. 14 shows a memory system 690 according to some embodiments. The front-end unit 610 includes a reassignment unit 612 that performs the reassignment of a logical group from one memory bank to a different bank. In general, the memory device will have logical groups assigned to memory banks according to a predetermined scheme or pattern throughout a first period of operation and then, if desirable, may have one or more logical groups reassigned by the reassignment unit to different memory banks. Thus, for example, a logical unit (such as a logical group) that is initially assigned to memory bank 0 may remain assigned to memory bank 0 throughout a first period of operation and then, if certain conditions are met, the logical unit may be reassigned to memory bank 1 for a second period of operation.

The front-end system includes a hot-bank identification unit 614 that identifies a particular memory bank as being more heavily worn than other memory banks. The hot-bank identification unit 614 may be activated under certain conditions (e.g. a given time after initialization, after a given number of write operations, when a given number of bad blocks are found, when ECC indicates a certain level of data corruption, or upon some host input or user input) or may operate on a continuous basis, or with some given frequency. In some cases, it is to be expected that hot-bank identification will not identify any heavily worn bank at any time throughout the operating life of the memory device. That is, wear is reasonably even across memory banks throughout the operating life of the product so that no individual memory bank is identified as a hot-bank. However, in some cases, because of how the host writes particular data, or for some other reason, one memory bank will suffer heavier wear and will be identified as a hot-bank.

A cold-bank identification unit 616 is also provided to identify a particular memory bank as a cold bank that has experienced less wear than other banks. Such a memory bank can then be used for reassignment of hot data. In some examples, cold-bank identification is not required and a cold-identification unit may not be provided in such memory systems.

The front-end system includes a hot-data identification unit 618 for identifying particular data as hot-data. In general, hot data is frequently written data. Frequent writes result in more wear because of erase and write operations required to store new versions of data and remove obsolete versions. While read operations may cause some wear of memory cells, this is generally much less than wear caused by write and erase operations, and so read operations may be ignored in most cases. In memory arrays where read operations cause significant wear, hot-data identification may take into account read frequency as well as write frequency.

The front-end system further includes a cold-data identification unit 620 for identifying particular data as cold data. Just as some data may be hot data that is frequently written by a host, some data may be cold data that is infrequently written by a host. For example, some files may be written just once by a host and may be maintained (not updated or deleted) over a significant portion of the operating life of the device. In contrast, some data such as memory management data may be frequently rewritten and may be considered hot-data. As will be explained below, not all systems may require cold-data identification.

It should be understood that the above components, the reassignment unit 612, hot-bank identification unit 614, cold-bank identification unit 616, hot-data identification unit 618, and cold-data identification unit 620 may be implemented in several different ways. For example, they may be implemented as physically separate components, or as dedicated circuits in a larger component such as an Application Specific Integrated Circuit (ASIC). In one example, these components are implemented through firmware in a memory controller. In other examples, the components are implemented through a combination of firmware and dedicated hardware.

Figure 15:
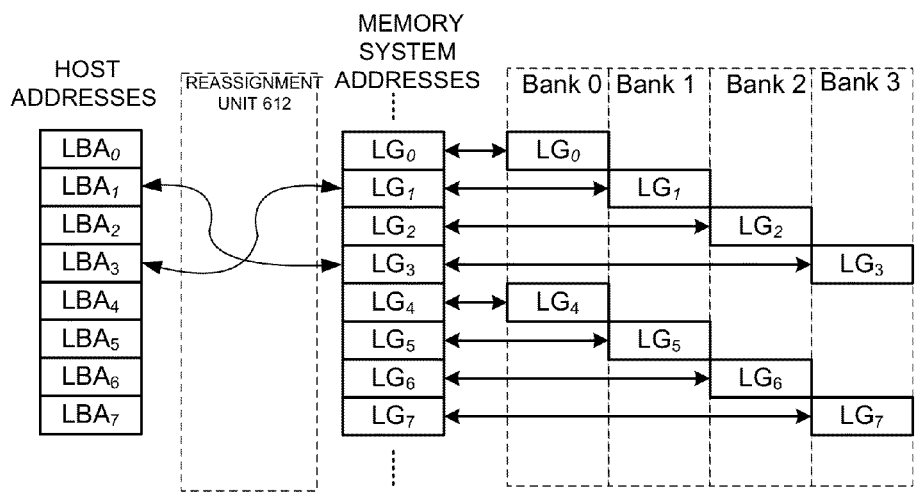
FIG. 15 illustrates reassignment of data from one memory-bank to another by a reassignment unit.

FIG. 15 shows an example of operation of a memory system according to certain embodiments. FIG. 15 shows reassignment of units of data from their originally assigned banks to different banks Host LBAs 0-7 are shown on the left and memory system addresses (LGs) 0-7 are shown on the right of the reassignment unit 612. When host addresses are initially assigned to memory system addresses a simple scheme is generally used. Thus, if the units used by the host and the memory system are the same (as shown here) a direct one-to-one assignment may be used, with $LBA_0$ mapped to $LG_0$, $LBA_1$ mapped to $LG_1$, and so on. Where different sized units are used, the assignment can still be a simple sequential assignment so that no complex record needs to be maintained. The memory system assigns each unit of data to a memory bank based on its memory system address (in this case, the same as its host address). In FIG. 15, $LBA_1$ was initially assigned the memory system address $LG_1$, which was assigned to memory bank 1. However, as shown in FIG. 15, the reassignment unit reassigns the unit of data with host address $LBA_1$ to memory system address $LG_3$, which is assigned to memory bank 3 and thus causes future access to this unit of data to be directed to memory bank 3 instead of memory bank 1.

An example of using the reassignment of FIG. 15 is where the data unit $LBA_1$ is frequently written by the host, which causes memory bank 1 to become heavily worn over an extended period of time. Such heavy wear of a memory bank may be detected by a hot-bank identification unit, and particular frequently written data causing such wear may be identified by a hot-data identification unit. The reassignment then takes place to ensure that the hot data is reassigned to another memory bank, thus reducing wear on the hot bank.

FIG. 15 also shows reassignment of $LBA_3$ to $LG_1$ so that $LBA_1$ and $LBA_3$ swop assignment. Such assignment may not always be part of a reassignment operation. $LBA_3$ may be identified as infrequently written data by a cold-data identification unit. This ensures that when $LBA_3$ replaces $LBA_1$ in memory bank 1 it causes much less wear than $LBA_1$ did (replacing hot-data with cold-data reduces wear, whereas if $LBA_3$ was also hot-data, wear might not be reduced). Also, memory bank 3 may be identified as a cold-bank by a cold-bank identification unit. This ensures that when $LBA_1$ is reassigned to memory bank 3 it does not wear out memory bank 3 too soon (i.e. memory bank 3 is a memory bank that has experienced relatively little wear so that it can endure the frequent writing associated with hot-data for a significant time).

Figure 16:
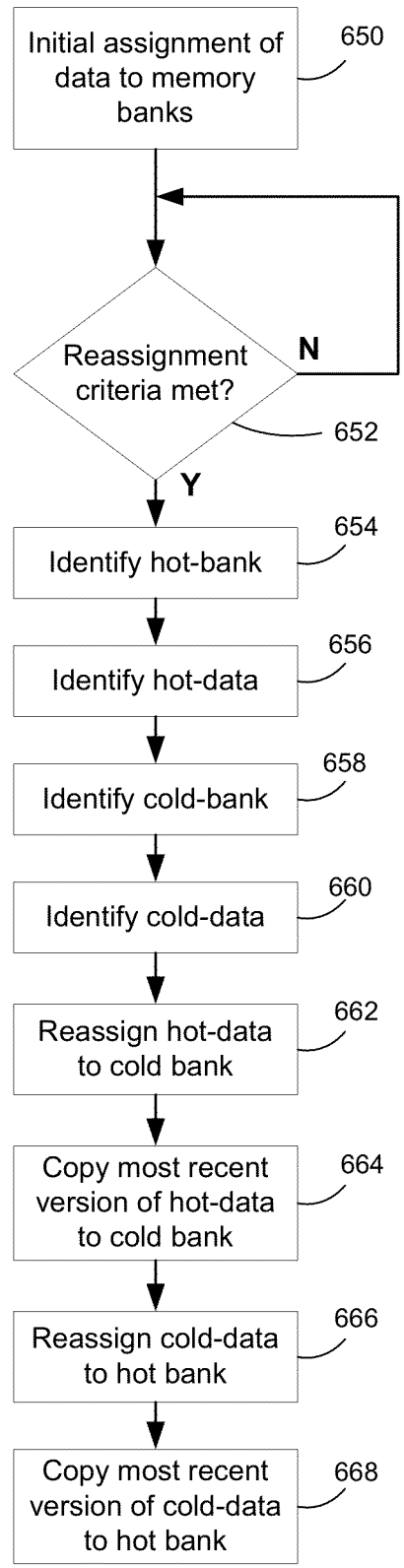
FIG. 16 shows a flowchart illustrating a reassignment operation that reassigns hot-data from one memory-bank to another.

FIG. 16 is a flowchart showing operation of a memory system according to some embodiments. Initially, data is assigned to memory banks according to logical addresses 650. In general, this uses the logical address of the data (as assigned by the host, or a logical address assigned by the memory system which may be derived from the logical address assigned by the host) to assign units of data in a regular repeating pattern across all memory banks. Alternative assignment schemes may also be used. In general such assignment schemes are simple repeated patterns.

Subsequently, the memory system checks to see if one or more criteria are met which would make reassignment desirable 652. Such reassignment criteria may include a particular time having elapsed after initialization; a given number of operations (write operations, erase operations, or other operations) having occurred; a number of bad blocks (or metablocks) occurring in the memory system, or in one or more memory bank (this could be bad blocks due to program failure, erase failure, or some other form of failure, and a block may be considered "bad" when a threshold number of errors occur in succession); a high level of corruption of data as indicated by ECC or some other technique; some input from a host or from a user; or a high number of write operations to a specific range of addresses. The memory system continues to operate with the initial assignment of data to memory banks until reassignment criteria are met. Thus, the memory system maintains the initial assignment scheme throughout a period of time (in some cases the entire operating life of the memory system) while checking to see if reassignment criteria are met.

In one example, a hot-bank identification unit is provided to monitor the memory banks of the memory system and to identify when one memory bank reaches a predetermined level of wear. In general, this predetermined level of wear is relative to other memory banks (i.e. if all memory banks wear uniformly then no one bank has high relative wear). However, absolute levels of wear may also be used. In one example, both the relative and absolute levels of wear are considered, and reassignment criteria are met when one memory bank has reached an absolute level of wear that is above a threshold that indicates that the memory bank has experienced significant wear (e.g. past 50% of its expected operating life), and has significantly more wear than other memory banks (e.g. it has at least 50% more wear than at least one other memory bank).

When reassignment criteria are met, a hot-bank is identified 654. This means that one particular memory bank is identified as being heavily worn and therefore being a good candidate for having some frequently written data reassigned to another memory bank. In some cases, the existence of such a hot-bank may be one of the reassignment criteria so that this step may be combined with step 652.

Once a hot-bank is identified, the memory system looks for frequently written data that is assigned to that bank 656. Hot-data may be identified in a number of ways such as by observing host writes over a certain period. As described previously, some memory systems keep certain data in binary cache while storing other data in MLC memory. In one example, any data stored in binary cache may be considered hot-data. In another example, only binary cached data is searched when looking for hot-data so that this provides an initial screening (data stored in MLC form may be ignored when looking for hot data in this example). Because such data is already known to be in binary cache this provides an easy way to identify the particular data in a hot-bank that is frequently written and therefore causing heavy wear.

The memory system may then identify a cold memory bank 658. This is simply a memory bank that has significantly less wear than the hot bank. While picking the least worn bank may be preferable in some cases, in other cases it is not necessary to identify the least worn bank. Simply identifying a memory bank that is significantly less worn than the hot-bank may be sufficient. Hot-bank and cold-bank identification may be combined in some examples where memory bank wear is monitored across all memory banks. In such systems, the identification of a cold bank may be part of checking if reassignment criteria are met (i.e. the existence of both a hot-bank and cold-bank may be criteria for reassignment). In some cases multiple cold-banks may be identified. In some cases, all memory banks other than the hot-bank may be considered as cold-banks, for example if they all have significantly less wear.

When a cold-bank is identified, certain data assigned to the cold-bank may be identified as cold-data 660. This is data that is infrequently written. In memory systems using a binary cache, such cold-data is generally stored in MLC memory. It may not be necessary to find the coldest data in a particular memory bank. In some cases any data in MLC memory may be sufficiently cold. The cold-data is for reassignment to the hot-bank when such reassignment is needed. However, as will be explained further below, not all reassignment schemes require reassignment of cold-data. So this step may not be necessary in all cases.

Once the hot-data is identified it is reassigned from the hot-bank to a cold-bank 662. This is generally done by a reassignment unit that reassigns the unit of data to a new logical address in the memory system. Thus, instead of using an address that is the same as the address used by the host logical address for the unit of data, or some simple variation of the host logical address, the unit of data is reassigned to a logical address that does not have a simple correspondence to its host logical address but instead requires maintaining some record that this reassignment has taken place. This may be considered a form of intentionally fragmenting data in the memory system (where, in general, fragmentation has been considered undesirable). Such fragmentation generally requires additional resources to manage, and access to fragmented data is generally slower because of the additional complexity. However, longer operational life, even with degraded performance, is generally preferable to device failure.

In order to reflect the reassignment and to allow access to the hot-data, the hot-data must be copied to the cold-bank 664. The most recent version of the hot-data is found in the hot-bank and is copied to the cold-bank in an operation that will be described in more detail below.

In many, though not all, cases, cold-data is reassigned to the hot-bank 666 to replace the hot-data that has been moved to the cold-bank. Such a swop is also described in more detail below.

When cold data is reassigned to the hot-bank, the most recent version of the cold data is found and is copied to the hot-bank to reflect its reassignment 668.

Figure 17:
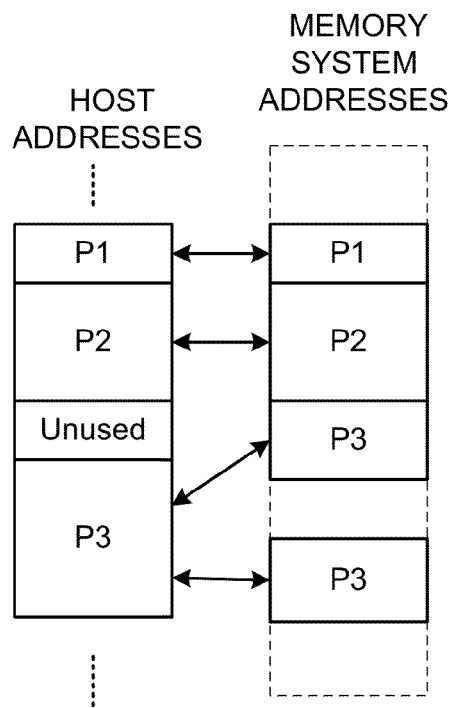
FIG. 17 illustrates the operation of a partition manager.

Certain embodiments may take advantage of partitioning functionality that may be present in certain memory systems. FIG. 17 shows how a partition manager in a memory system may assign host logical addresses to memory system logical addresses. In particular, where the host specifies that certain logical address ranges are assigned to certain partitions, the memory system uses the partition manager to manage data in the memory system accordingly. Different policies may apply to different partitions (e.g. one partition may be used for frequently written data and may require the data to be maintained in binary form, whereas another partition may require its data to be maintained in MLC form). In general, when the host designates a certain logical address range in the host logical address space as a partition, the partition manager designates a corresponding logical address range in the memory system logical address space. For example, partitions P1 and P2 are created by the host and the partition manager creates corresponding partitions P1 and P2 that extend over corresponding logical address ranges in the memory system logical address space. The host also creates partition P3, which is a continuous logical address range in host logical address space. But in this case the partition manager does not create a corresponding partition in the memory system logical address space. Instead, the partition manager creates a partition that consists of two separate logical address ranges (both marked P3) that are separated by a logical address gap. In some cases a partition manager may be used to manage reassignment of units of data from one bank to another.

Figure 18:
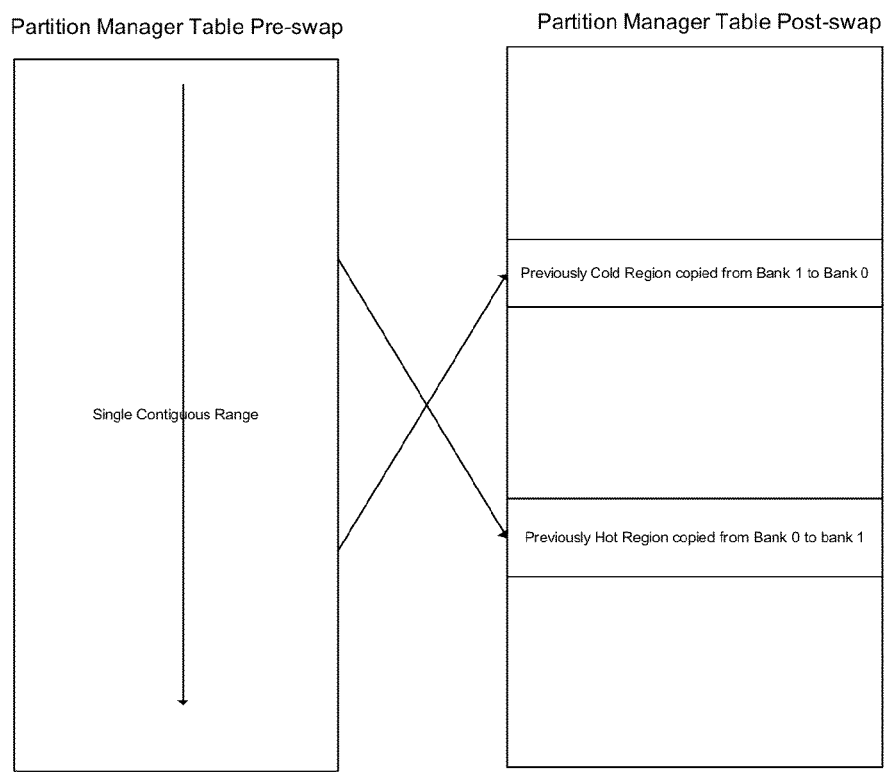
FIG. 18 illustrates reassignment by of hot-data and cold-data within a partition.

FIG. 18 shows an example of a partition manager table for a typical partition. Prior to any reassignment the partition consists of a contiguous range of logical addresses as shown on the left. In other words, the partition consists of a contiguous range of host logical addresses, which were assigned by the partition manager to a contiguous range of memory system logical addresses. This corresponds to partitions P1 and P2 in FIG. 17. However, subsequently, after a reassignment of one or more units of data the partition manager table is as shown on the right. The logical addresses are no longer contiguous because some hot-data was reassigned from memory bank 0 to memory bank 1 and some cold-data was reassigned from memory bank 1 to memory bank 0. In this case, the reassignment occurred within a single partition (i.e. both the hot-data and the cold-data were in the same partition). In some memory systems, only reassignment or swopping within a single partition may be possible. However, in other cases reassignment may be from one partition to another.

In general, in addition to reassigning data from one memory bank to another memory bank, some copying of data will also be needed so that the data is present in the memory bank that is reflected by its new assignment.

Figure 19:
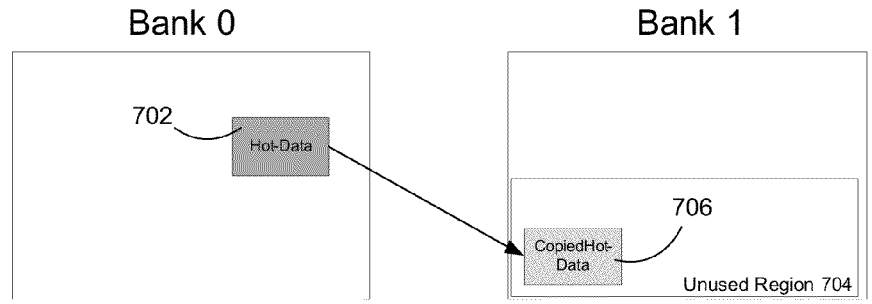
FIG. 19 illustrates copying hot-data in a hot-bank to an unused region within a cold-bank.

FIG. 19 shows an example of copying of hot-data 702 from a memory bank identified as a hot-bank (bank 0) to a memory bank identified as a cold-bank (bank 1). In this case, a portion of bank 1 is unused (unused region 704). This could be for several reasons. In some cases, a host may not use the entire capacity of a memory device so that there is some spare capacity that is unused. It will be understood that FIG. 19 illustrates the logical space rather than the physical space of the memory banks. Thus, bank 1 may use the entire available physical space over its operational life while only using a portion of the possible logical space. Typically, because of how data is assigned to memory banks, if there is unused logical space in one memory bank then there may be similarly unused space in other memory banks, though this may not always be the case. When bank 1 is identified as a cold-bank, it may also be determined that there is sufficient unused space in bank 1 to allow the hot-data from bank 0 to be stored there. In this case, the hot-data is reassigned to one or more unused logical addresses that are assigned to bank 1. The unused addresses may be beyond the host logical address range, or reserved for the memory system, or in some other way guaranteed not to be used by the host. Hot-data is copied from bank 0 to bank 1 so that copied hot data 706 is written in unused region 704. No further copying is needed in this case. There is no need to reassign any cold-data from bank 1 to bank 0, or to copy any data from bank 1 to bank 0. In other examples, there may not be one single memory bank with sufficient unused space to hold all the hot-data that is desirable to move, but there may be sufficient unused space in two or more cold-banks to hold all the hot-data from the hot-bank. In such examples, the hot-data may be distributed across unused regions of two or more cold-banks.

Figure 20A:
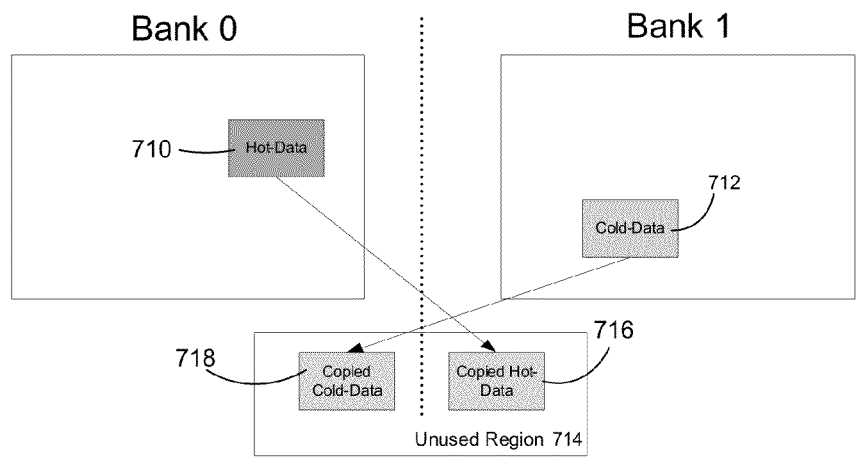
FIG. 20A illustrates copying of hot-data and cold-data to an unused region.
Figure 20B:
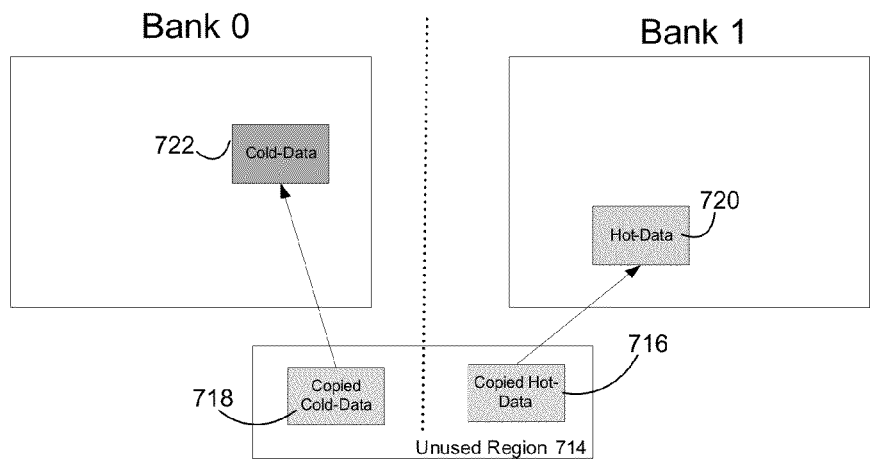
FIG. 20B illustrates copying of hot-data and cold-data from the unused region of FIG. 20A into their swopped locations.

FIGS. 20A-B shows another example of copying data where both hot-data 710 and cold-data 712 are copied. In this example, hot-data is reassigned to a cold-bank (bank 1) and cold-data is reassigned to a hot-bank (bank 0) (as shown in FIG. 15). Such a swop must be reflected in the physical location of existing data in the memory array which requires copying of both hot and cold data. FIG. 20A shows that, in addition to copying hot-data 710 to an unused region 714 (which may be in bank 1 or elsewhere), cold-data 712 in bank 1 is also copied to unused region 714 so that copied hot-data 716 and copied cold-data 718 are written in unused region 714. When the data has been copied, the original data may be deleted (i.e. hot-data 710 deleted from bank 0, cold-data 712 deleted from bank 1). Then, as shown in FIG. 20B, the copied hot-data 716 is copied into bank 1 (written as hot-data 720) and the copied cold data 718 is copied into bank 0 (written as cold data 722) so that the hot-data and cold-data are physically swopped between bank 0 and bank 1 thus reflecting the swopping of their logical addresses. The copies 716, 718 in the unused region 714 may be deleted once copies 720, 722 are present in their swopped locations.

During copying of data from one bank to another it is possible that the host could attempt to access the data being copied. If copying to the unused region is not complete, then access should be to the bank from which the data is being copied. If copying to the unused region is complete and the data in the original banks has been erased then access should be to the unused region. Subsequently, in the case of a host write, copying would restart and would reflect any modification to the data from the host write. For a host read the data remains unchanged and so copying does not have to be restarted.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a multi-bank nonvolatile memory system that has a plurality of banks, each with its own logical-to-physical mapping, comprising:
   assigning units of data to be stored by the multi-bank nonvolatile memory system to individual banks of the plurality of banks, based on logical addresses of the units of data to be stored, according to a predetermined assignment scheme;
   maintaining the assignment of the units of data to the individual banks of the plurality of banks throughout a first period of operation of the multi-bank nonvolatile memory system;
   subsequently, identifying at least one unit of data that is assigned to a first bank by the predetermined assignment scheme as frequently written data;
   in response to identifying the at least one unit of data as frequently written data, reassigning the frequently written data to a second bank of the plurality of banks; and
   maintaining the reassignment of the frequently written data for a second period of operation of the multi-bank nonvolatile memory system, while other units of data assigned to the first bank by the predetermined assignment scheme that are not identified as frequently written remain assigned to the first bank throughout the second period of operation of the multi-bank nonvolatile memory system.

2. The method of claim 1 wherein the first period of operation is from initialization of the multi-bank nonvolatile memory system until a predetermined amount of wear has occurred, and the second period of operation extends from after the first period of operation until end of life of the multi-bank nonvolatile memory system.

3. The method of claim 1 wherein the predetermined assignment scheme stripes data across the plurality of banks.

4. The method of claim 1 further comprising, in response to identifying the at least one unit of data as frequently written data, copying a copy of the frequently written data from the first bank to the second bank.

5. The method of claim 1 further comprising identifying at least one unit of data in the second bank as infrequently written data.

6. The method of claim 5 further comprising, in response to identifying the at least one unit of data as infrequently written data, reassigning the infrequently written data from the second bank to the first bank; and
   maintaining the reassignment of the infrequently written data for the second period of operation of the multi-bank nonvolatile memory system.

7. The method of claim 1 wherein, for units of data in the first bank and in the second bank that are not identified as either frequently written data or infrequently written data, assignment according to the predetermined assignment scheme is maintained throughout the first period of operation and throughout the second period of operation.

8. A multi-bank nonvolatile memory system comprising:
a plurality of nonvolatile memory banks, an individual one of the plurality of nonvolatile memory banks maintaining a logical-to-physical address translation table that records locations at which data is physically located within physical memory of the individual nonvolatile memory bank;
a front-end logic unit that assigns units of data to be stored by the multi-bank nonvolatile memory system to individual banks of the plurality of banks, based on logical addresses of the units of data to be stored, according to a predetermined assignment scheme, for a first period of operation of the multi-bank nonvolatile memory system;
a hot-data identification unit that identifies one or more of the units of data in a first bank as frequently written over the first period of operation; and
a reassignment unit that reassigns the one or more units of data that are identified as frequently written, such that the one or more units of data are assigned for a second period of operation, that is subsequent to the first period of operation, to a second bank of the plurality of banks that is different to the first bank to which they were assigned for the first period of operation while other units of data assigned to the first bank according to the predetermined assignment scheme for the first period remain assigned to the first bank for the second period.

9. The multi-bank nonvolatile memory system of claim 8 further comprising a hot-bank identification unit that identifies a memory bank of the plurality of banks as a heavily worn memory bank.

10. The multi-bank nonvolatile memory system of claim 8 further comprising a cold-data identification unit that identifies one or more portions of data as infrequently written over the first period of operation.

11. The multi-bank nonvolatile memory system of claim 8 further comprising a cold-bank identification unit that identifies a memory bank of the plurality of banks as a lightly worn memory bank.

12. The multi-bank nonvolatile memory system of claim 8 wherein the plurality of nonvolatile memory banks contains NAND flash memory blocks.

13. The method of claim 1 further comprising:
prior to identifying the at least one unit of data as frequently written data, identifying the first bank as a heavily worn bank; and
in response to identifying the first bank as a heavily worn bank, searching for frequently written data that is assigned to the first bank.

14. The method of claim 1 wherein the reassigning the frequently written data includes reassigning a host logical address from a first memory logical address to a second memory logical address.

15. A method of operating a multi-bank nonvolatile memory system that has a plurality of banks, comprising:
assigning units of data to be stored by the multi-bank nonvolatile memory system to individual banks of the plurality of banks, based on logical addresses of the units of data to be stored, according to a predetermined assignment scheme;
maintaining the assignment of the units of data to the individual banks of the plurality of banks throughout a first period of operation of the multi-bank nonvolatile memory system;
subsequently, identifying a first bank of the plurality of banks as a heavily worn bank;
subsequently, identifying a unit of data that is assigned to the first bank by the predetermined assignment scheme as frequently written data;
in response to identifying the unit of data as frequently written data, reassigning the frequently written data to a second bank of the plurality of banks; and
subsequently maintaining the reassignment of the unit of data for a second period of operation of the multi-bank nonvolatile memory system, while other units of data assigned to the first bank by the predetermined assignment scheme remain assigned to the first bank throughout the second period of operation of the multi-bank nonvolatile memory system.

* * * * *